United States Patent
Tsuji

(10) Patent No.: US 11,502,002 B2
(45) Date of Patent: Nov. 15, 2022

(54) METHOD FOR MANUFACTURING SEMICONDUCTOR DEVICE

(71) Applicant: DAICEL CORPORATION, Osaka (JP)

(72) Inventor: Naoko Tsuji, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 0 days.

(21) Appl. No.: 17/057,828

(22) PCT Filed: May 27, 2019

(86) PCT No.: PCT/JP2019/020955
§ 371 (c)(1),
(2) Date: Nov. 23, 2020

(87) PCT Pub. No.: WO2019/230668
PCT Pub. Date: Dec. 5, 2019

(65) Prior Publication Data
US 2021/0111072 A1     Apr. 15, 2021

(30) Foreign Application Priority Data

May 28, 2018   (JP) .............................. JP2018-101929

(51) Int. Cl.
*H01L 21/768*    (2006.01)
*H01L 21/02*     (2006.01)
*H01L 21/308*    (2006.01)

(52) U.S. Cl.
CPC .. *H01L 21/76898* (2013.01); *H01L 21/02063* (2013.01); *H01L 21/308* (2013.01); *H01L 21/76831* (2013.01)

(58) Field of Classification Search
CPC ......... H01L 21/76898; H01L 21/02063; H01L 21/308; H01L 21/76831
See application file for complete search history.

(56) References Cited

U.S. PATENT DOCUMENTS 6,355,563 B1 *  3/2002  Cha ................... H01L 21/76802
                                                  257/E21.576
6,399,512 B1 *  6/2002  Blosse ............. H01L 21/76814
                                                  257/E21.507

(Continued)

FOREIGN PATENT DOCUMENTS

JP        10-74891 A     3/1998
JP       2012-9473 A     1/2012

(Continued)

OTHER PUBLICATIONS

International Search Report for International Application No. PCT/JP2019/020955, dated Jul. 30, 2019, with an English translation.

(Continued)

*Primary Examiner* — Dale E Page
*Assistant Examiner* — Quovaunda Jefferson
(74) *Attorney, Agent, or Firm* — Birch, Stewart, Kolasch & Birch, LLP

(57) ABSTRACT

Provided is a method for manufacturing a semiconductor device suitable for achieving low wiring resistance between semiconductor elements that is bonded via an adhesive layer and multi-layered. The method according to the present invention is as follows. First, a wafer laminate (W) is prepared, the wafer laminate (W) including a wafer (10) having a circuit forming surface (10a), a wafer (20) having a main surface (20a) and a back surface (20b), and an adhesive layer (30) containing an SiOC-based polymer. Then, a hole (H) is formed in the wafer laminate (W) by etching the wafer laminate (W) from the wafer (20) side via a mask pattern masking a portion of the main surface (20a) side of the wafer (20), the hole (H) extending through the wafer (20) and the adhesive layer (30) and reaching a wiring pattern (12b) in the wafer (10). Then, an insulating film (41) is formed on an inner surface of the hole (H). Then, the insulating film (41) on a bottom surface of the hole (H) is (Continued)

removed. Then, the wafer laminate (W) is subjected to a cleaning treatment (an oxygen plasma treatment and/or an Ar sputtering treatment). Then, a conductive portion is formed in the hole (H).

7 Claims, 7 Drawing Sheets

(56) References Cited

U.S. PATENT DOCUMENTS

| | | | | |
|---|---|---|---|---|
| 6,713,402 | B2* | 3/2004 | Smith | H01L 21/76814 |
| | | | | 257/E21.252 |
| 7,207,339 | B2* | 4/2007 | Chen | B08B 7/00 |
| | | | | 134/1.1 |
| 7,244,683 | B2* | 7/2007 | Chung | H01L 21/02063 |
| | | | | 438/785 |
| 9,269,562 | B2 | 2/2016 | Dinsmore et al. | |
| 9,299,640 | B2 | 3/2016 | Lin | |
| 9,831,156 | B2 | 11/2017 | Lin | |
| 10,847,443 | B2 | 11/2020 | Lin | |
| 2003/0082356 | A1* | 5/2003 | Suemasu | H01L 21/288 |
| | | | | 428/209 |
| 2009/0203207 | A1* | 8/2009 | Doi | H01L 21/02063 |
| | | | | 257/E21.477 |
| 2011/0147955 | A1* | 6/2011 | Kashiwagi | C08L 83/04 |
| | | | | 257/791 |
| 2014/0196746 | A1 | 7/2014 | Dinsmore et al. | |
| 2015/0021784 | A1 | 1/2015 | Lin | |
| 2016/0204084 | A1 | 7/2016 | Lin | |
| 2017/0005000 | A1* | 1/2017 | Beyne | H01L 21/76898 |
| 2018/0145011 | A1 | 5/2018 | Lin | |
| 2021/0043547 | A1 | 2/2021 | Lin | |

FOREIGN PATENT DOCUMENTS

| | | |
|---|---|---|
| JP | 2014-175542 A | 9/2014 |
| JP | 2015-164160 A | 9/2015 |
| JP | 2016-4835 A | 1/2016 |
| JP | 2016-178162 A | 10/2016 |
| TW | 201430945 A | 8/2014 |
| TW | 201505154 A | 2/2015 |

OTHER PUBLICATIONS

Written Opinion for International Application No. PCT/JP2019/020955, dated Jul. 30, 2019, with an English translation.

Taiwanese Office Action and Search Report for corresponding Taiwanese Application No. 108118401, dated Jul. 19, 2022.

* cited by examiner (a)

(b)

METHOD FOR MANUFACTURING SEMICONDUCTOR DEVICE

TECHNICAL FIELD

The present invention relates to a method for manufacturing a semiconductor device having a laminated structure including a plurality of semiconductor elements. The present application claims priority to JP 2018-101929 filed in Japan on May 28, 2018, the content of which is incorporated herein.

BACKGROUND ART

In recent years, primarily for the purpose of further increasing the density of semiconductor devices, technology for manufacturing semiconductor devices having a three-dimensional structure in which a plurality of semiconductor chips or semiconductor elements is integrated in their thickness direction has been developed. One of such a technology known in the art is what is called a wafer-on-wafer (WOW) process. In the WOW process, a predetermined number of semiconductor wafers, in each of which a plurality of semiconductor elements is fabricated, are sequentially laminated to form a structure. In the structure, the semiconductor elements are arranged in multiple levels in their thickness direction, and the wafer laminate is divided into individual semiconductor devices through a dicing process. Technology relating to such a WOW process is described, for example, in Patent Documents 1 and 2 listed below.

CITATION LIST

Patent Document

Patent Document 1: JP 2016-004835 A
Patent Document 2: JP 2016-178162 A

SUMMARY OF INVENTION

Technical Problem

In the WOW process, a via extending through the wafer is formed. The via, i.e. a through electrode, is formed in different wafers in the wafer laminate for electrically connecting semiconductor elements. The through electrode is formed, for example, through forming a hole through the wafer in the thickness direction by reactive ion etching and filling the hole with a conductive material.

On the other hand, for bonding the wafers to be multi-layered, the use of an adhesive is conceivable. In addition, to form a through electrode in an upper wafer that is laminated on the wafer via an adhesive layer, the through electrode being conductive with the semiconductor element of the lower wafer, in the forming the hole, the hole needs to be formed by reactive ion etching to make the hole extend through the upper wafer and the adhesive layer that is provided directly under the upper wafer. Such a hole is filled with a conductive material.

However, after the reactive ion etching on the adhesive layer, an etching residue may be present in the formed hole. When an adhesive is used for the wafer bonding, in the WOW process known in the art, this etching residue may lead to increasing wiring resistance between the semiconductor elements to be electrically connected with the through electrode.

The present invention was conceived under the circumstances as described above, and an object of the present invention is to provide a technique suitable for achieving low wiring resistance between semiconductor elements which are multi-layered in a method for manufacturing a semiconductor device in which the semiconductor elements are multi-layered through laminating semiconductor wafers via an adhesive layer.

Solution to Problem

A method for manufacturing a semiconductor device provided by an embodiment of the present invention is a method to multi-layer semiconductor elements through laminating semiconductor wafers via an adhesive layer and includes at least the following (1) to (6).

(1) A wafer laminate is prepared. This wafer laminate has a laminated structure including a first wafer having a circuit forming surface including a wiring pattern and a back surface opposite to the circuit forming surface, a second wafer having a main surface and a back surface opposite to the main surface, and an adhesive layer containing an SiOC-based polymer and provided between the circuit forming surface of the first wafer and the back surface of the second wafer. The SiOC-based polymer is a polymer containing at least silicon, oxygen, and carbon as constituent elements and includes an SiOCH-based polymer further containing hydrogen. In the SiOC-based polymer, the proportion of carbon is, for example, from 20 to 70 mass %, the proportion of hydrogen is, for example, from 2 to 20 mass %, the proportion of oxygen ratio is, for example, from 10 to 40 mass %, and the proportion of silicon is, for example, from 3 to 40 mass %. The circuit forming surface refers to a surface of a side on which semiconductor elements are fabricated and what is called a rewiring layer is formed on the elements in the wafer. The main surface refers to a surface on a side on which semiconductor elements are fabricated on the wafer.

(2) A hole is formed in the wafer laminate by etching the wafer laminate from the second wafer side via a mask pattern masking a portion of the main surface side of the second wafer, the hole extending through the second wafer and the adhesive layer and reaching a wiring pattern in the first wafer. In the etching treatment, reactive ion etching is preferably performed. In addition, in the wiring pattern, a portion facing the hole forms a bottom surface of the hole.

(3) An insulating film is formed on an inner surface including a wall surface and the bottom surface of the hole.

(4) A portion of the insulating film in the hole, which is on the wiring pattern (i.e., a portion of the insulating film which exists on the bottom surface of the hole), is etched away.

(5) The wafer laminate in which the hole is formed is subjected to a cleaning treatment. This cleaning treatment includes an oxygen plasma cleaning treatment and/or an argon sputtering cleaning treatment.

(6) A conductive portion is formed by filling a conductive material into the hole that has undergone the washing treatment. The conductive portion which is formed is structurally and electrically connected to the wiring pattern of the circuit forming surface of the first wafer. This conductive portion is to form a through electrode for electrically connecting a semiconductor element derived from the first wafer and a semiconductor element derived from the second wafer in a semiconductor device to be manufactured. Preferably, a barrier layer is formed on the wall surface of the hole prior to forming the conductive portion in (6). In addition, a technique for filling the conductive material in (6) is an electroplating method.

In the method for manufacturing a semiconductor device according to an embodiment of the present invention, as described above, the conductive portion that is to form a through electrode for electrically connecting the semiconductor elements is structurally and electrically connected to the wiring pattern of the circuit forming surface of the first wafer. Such a bumpless structure is suitable for achieving a short conductive path between the semiconductor elements which are multi-layered. In the WOW process known in the art, a bump electrode, which is electrically connected to a through electrode extending through the wafer, is formed on the wafer surface, and an electrical connection between the semiconductor elements in different wafers via the bump electrode may be attempted. In contrast, in the method for manufacturing a semiconductor device according to an embodiment of the present invention, the conductive portion that is to form a through electrode is directly connected to the wiring pattern in the first wafer, and thus a bumpless structure is formed in the electrical connection between the semiconductor elements present in different wafers. Such a bumpless structure is suitable for achieving a short conductive path between the semiconductor elements which are multi-layered, as described above. The shorter the conductive path between the semiconductor elements which are multi-layered, the smaller the resistance of the conductive path or the wiring between the elements tends to be.

Additionally, the method for manufacturing a semiconductor device according to an embodiment of the present invention is a method to form multi-layer semiconductor elements through laminating semiconductor wafers via the adhesive layer as described above, and the adhesive layer bonding the wafers contains an SiOC-based polymer. In addition, in the present method, the wafer laminate, in which the hole extending through the wafer and the adhesive layer is formed, is subjected to the cleaning treatment including the oxygen plasma cleaning treatment and/or the argon sputtering cleaning treatment in the cleaning of (5). The present invention has found that these configurations are suitable for achieving low contact resistance between the conductive portion or the through electrode that is formed in the hole and the wiring pattern in the circuit forming surface of the first wafer. This is, for example, as shown with reference to examples and comparative examples described later. The smaller the contact resistance between the conductive portion or the through electrode in the hole and the wiring pattern in the circuit forming surface of the first wafer, the smaller the resistance of the entire conductive path or the entire wiring between the semiconductor elements that are electrically connected via the through electrode in the semiconductor device to be manufactured tends to be.

As described above, the present method for manufacturing a semiconductor device is suitable for achieving low wiring resistance between the semiconductor elements that are bonded and multi-layered via the adhesive layer. Such a method for manufacturing a semiconductor device is suitable for reducing high speed signal transmission at low power consumption in the semiconductor device to be manufactured and is also suitable for reducing attenuation of a high frequency signal.

In performing the oxygen plasma cleaning treatment in the cleaning of (5) of the present method for manufacturing a semiconductor device, the treatment time is preferably from 5 to 120 seconds, more preferably from 10 to 60 seconds, and even more preferably from 15 to 40 seconds.

In performing the argon sputtering cleaning treatment, the treatment time is preferably from 0.5 to 5 minutes and more preferably from 2 to 4 minutes. In addition, the cleaning treatment in (5) includes the oxygen plasma cleaning treatment and the subsequent argon sputtering cleaning treatment. In that case, the cleaning treatment preferably includes a sulfuric acid cleaning treatment between these treatments. These configurations are suitable for achieving low contact resistance between the conductive portion or the through electrode which are formed in the hole and the wiring pattern in the circuit forming surface of the first wafer.

The adhesive layer preferably contains a siloxane-based organic-inorganic hybrid adhesive and is more preferably a cured product of an adhesive composition containing a polyorganosilsesquioxane containing a polymerizable functional group (polymerizable group-containing polyorganosilsesquioxane). The siloxane-based organic-inorganic hybrid adhesive refers to an adhesive polymer material containing a structural unit having a siloxane bond and an organic group which is bonded to silicon that forms the siloxane bond. Such an adhesive layer is suitable for achieving high heat resistance as well as achieving lower curing temperature for forming the adhesive layer and thus preventing damage to the elements in the wafer as an adherend.

The thickness of the adhesive layer is preferably not greater than 5 µm. Such a configuration is suitable for achieving a shorter conductive portion or through electrode that is formed in the present method and thus is suitable for reducing the resistance of the entire conductive path or the entire wiring between the semiconductor elements which are electrically connected via the through electrode. In addition, the adhesive layer containing the siloxane-based organic-inorganic hybrid adhesive is suitable for exhibiting sufficient wafer bonding strength even with such a small thickness.

The thickness of the second wafer is preferably not greater than 20 µm and more preferably not greater than 15 µm. Such a configuration is suitable for achieving a shorter conductive portion or through electrode that is formed in the present method and thus is suitable for reducing the resistance of the entire conductive path or the entire wiring between the semiconductor elements which are electrically connected via the through electrode.

DESCRIPTION OF EMBODIMENTS

Figure 1:
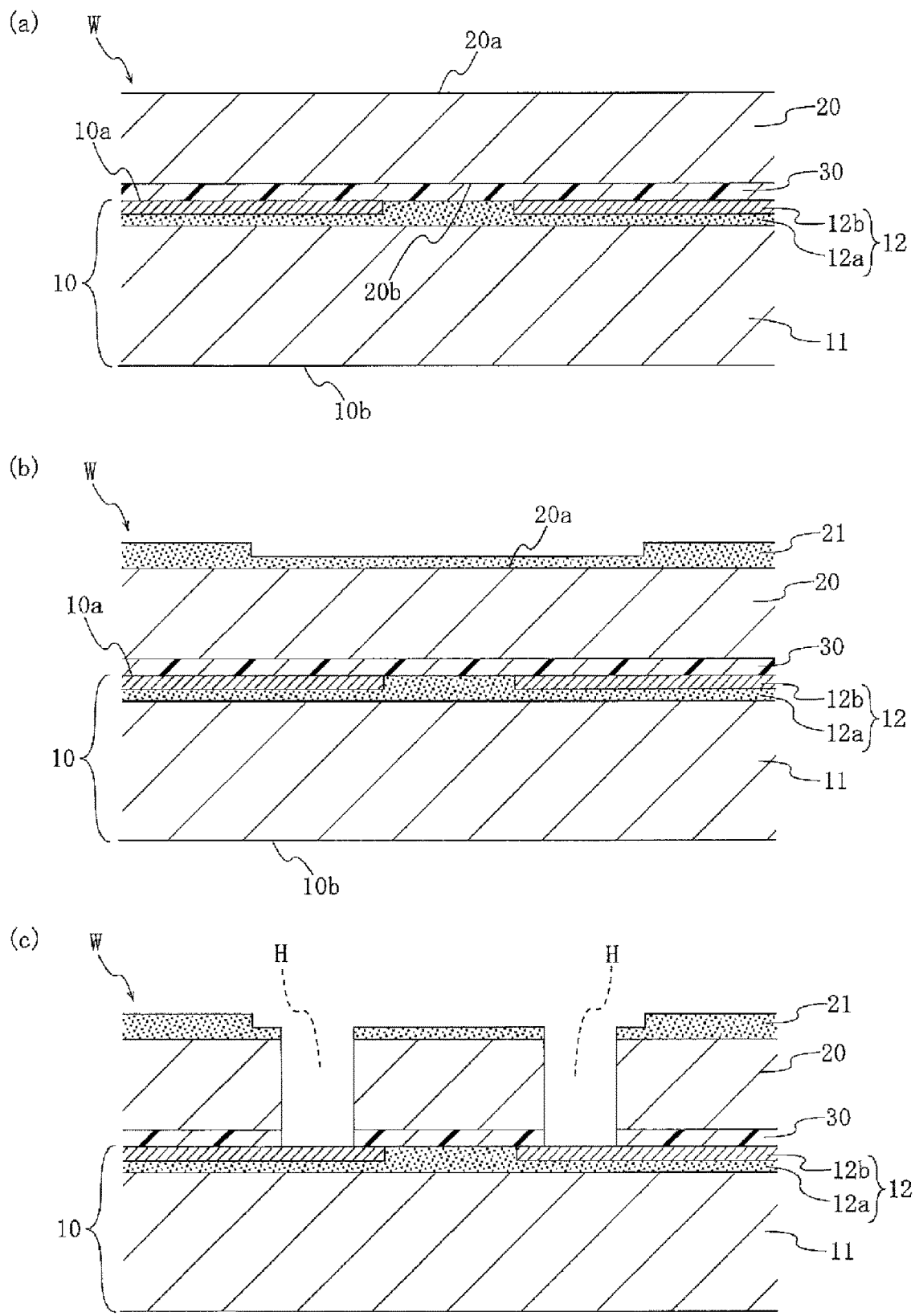
FIGS. 1(a), (b), and (c) illustrate some processes in a method for manufacturing a semiconductor device according to an embodiment of the present invention.
Figure 2:
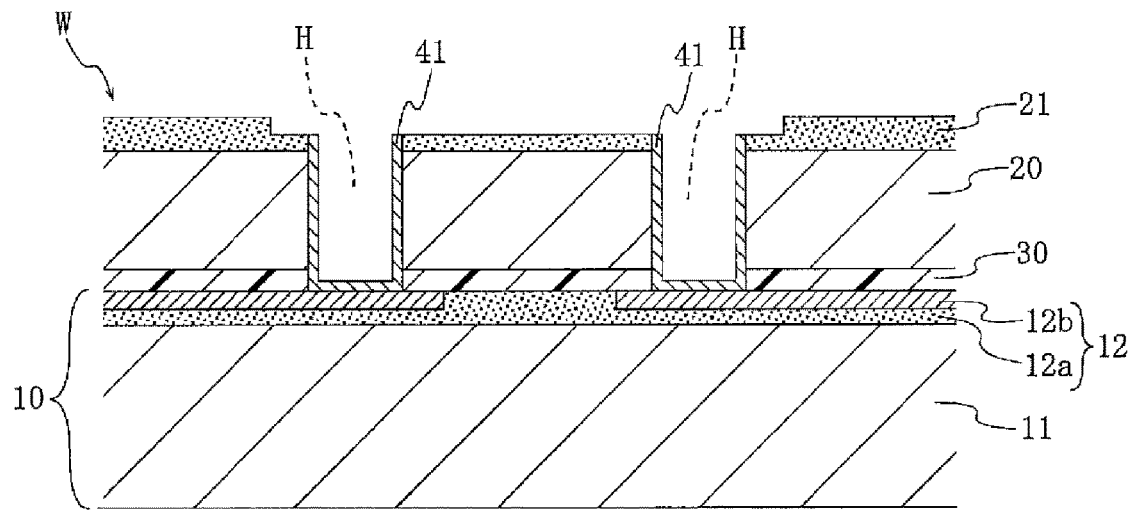
FIGS. 2(a) and (b) illustrate some processes in a method for manufacturing a semiconductor device according to an embodiment of the present invention.
Figure 2:
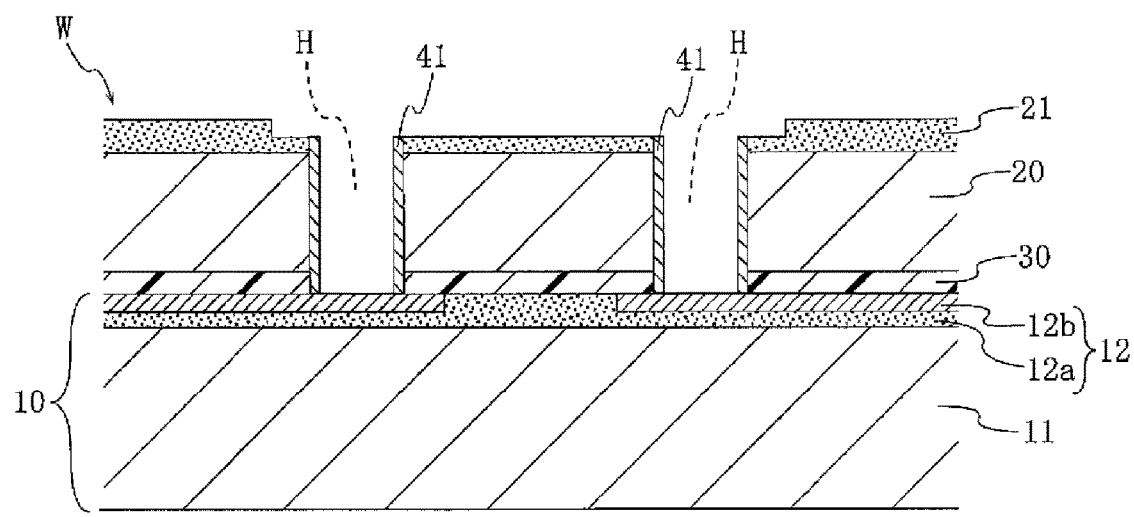
Figure 3:
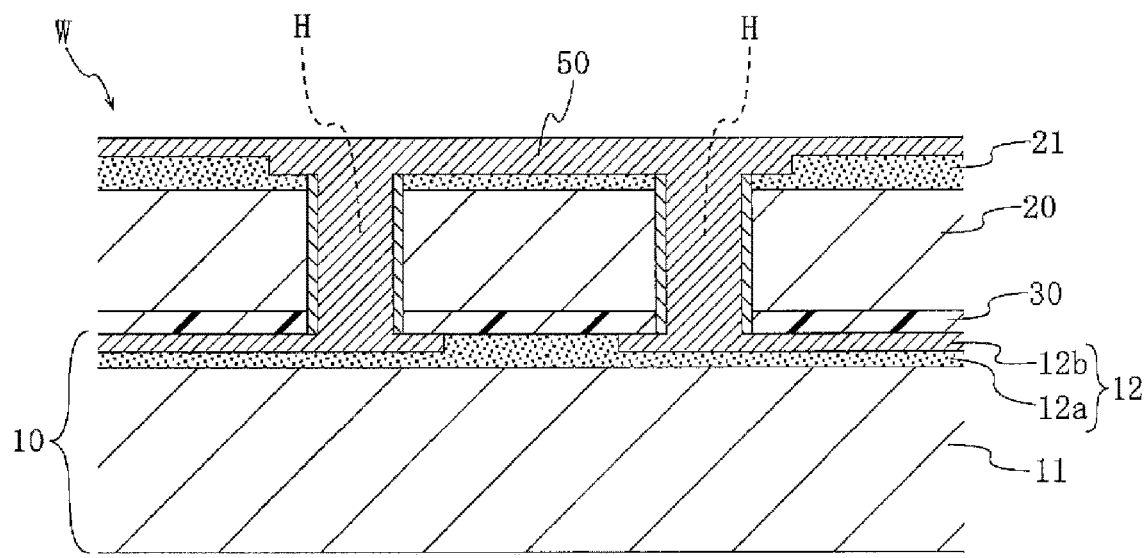
FIGS. 3(a) and (b) illustrate some processes in a method for manufacturing a semiconductor device according to an embodiment of the present invention.
Figure 3:
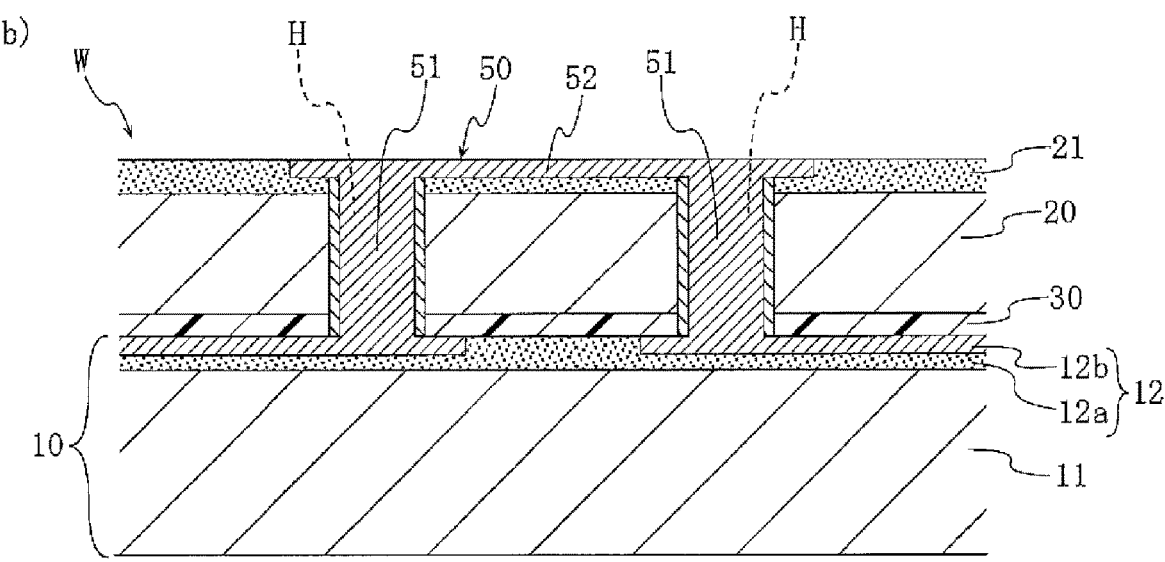

FIGS. 1 to 3 illustrate a method for manufacturing a semiconductor device according to an embodiment of the present invention. This manufacturing method is a method for manufacturing a semiconductor device having a three-dimensional structure in which semiconductor elements are integrated in their thickness direction, and FIG. 1 to FIG. 3 illustrate manufacturing processes in partial cross-sectional views.

In the present method for manufacturing a semiconductor device, first, a wafer laminate W as illustrated in FIG. 1(a) is prepared (preparation). This wafer laminate W has a laminated structure including a wafer 10, a wafer 20, and an adhesive layer 30 between the wafer 10 and the wafer 20.

The wafer 10 is a wafer that has undergone transistor formation and rewiring layer formation, includes a main body portion 11 and a rewiring layer 12, and has a circuit forming surface 10a on the rewiring layer 12 side and a back surface 10b opposite to the circuit forming surface 10a. A plurality of semiconductor elements (not illustrated) is fabricated on one side of the main body portion 11 of the wafer 10, and the rewiring layer 12 is formed on the elements. The rewiring layer 12 has an insulating portion 12a and a wiring pattern 12b. The circuit forming surface 10a is a surface of the side on which such a rewiring layer 12 is formed in the wafer 10. The wiring pattern 12b of the rewiring layer 12 has a portion facing outward of the rewiring layer 12 in the circuit forming surface 10a. That is, the circuit forming surface 10a includes an exposed region of the wiring pattern 12b. The thickness of such a wafer 10 is, for example, from 300 to 800 μm. The wafer 10 may be thinned by grinding from the back surface 10b side later.

The wafer 20 is a wafer that has undergone transistor formation and has a main surface 20a and a back surface 20b opposite to the main surface 20a. The main surface 20a of the wafer 20 is a surface of the side on which a plurality of semiconductor elements (not illustrated) is fabricated in the wafer 20. The thickness of the wafer 20 is not greater than 30 μm in the present embodiment, preferably not greater than 20 μm, and more preferably not greater than 15 μm.

Examples of a semiconductor material for forming the main body portion of the wafers 10 and 20 include silicon (Si), germanium (Ge), silicon carbide (SiC), gallium arsenide (GaAs), gallium nitride (GaN), and indium phosphide (InP).

The adhesive layer 30 contains a SiOC-based polymer and is provided between the circuit forming surface 10a of the wafer 10 and the back surface 20b of the wafer 20. The SiOC-based polymer is a polymer containing at least silicon, oxygen, and carbon as constituent elements and includes an SiOCH-based polymer further containing hydrogen. In the SiOC-based polymer, the proportion of carbon is, for example, from 20 to 70 mass %, the proportion of hydrogen is, for example, from 2 to 20 mass %, the proportion of oxygen ratio is, for example, from 10 to 40 mass %, and the proportion of silicon is, for example, from 3 to 40 mass %.

The adhesive layer 30 preferably contains a siloxane-based organic-inorganic hybrid adhesive and is more preferably a cured product of an adhesive composition containing a polymerizable group-containing silsesquioxane. The siloxane-based organic-inorganic hybrid adhesive refers to an adhesive polymer material containing a structural unit having a siloxane bond, the structural unit in which an organic group is bonded to silicon forming the siloxane bond.

The wafer laminate W illustrated in FIG. 1(a) can be produced, for example, through processes as follows. First, the circuit forming surface 10a side of the wafer 10 described above, which has undergone the transistor formation and the rewiring layer formation, and a wafer (an additional wafer) that is to form the wafer 20 described above are bonded via the adhesive layer 30. Then, the surface in the additional wafer, the surface opposite to the surface bonded to the wafer 10, is ground using a grinder to thin the additional wafer to a predetermined thickness. Then, in the exposed surface of the thinned additional wafer (the surface opposite to the surface bonded to the wafer 10), a semiconductor element is formed through the transistor formation or the like. For example, as described above, the wafer laminate W described above having a laminated structure including the wafers 10 and 20 and the adhesive layer 30 bonding the wafers 10 and 20 can be produced.

The composition for forming the adhesive layer 30 described above contains, as a curable resin, an SiOC-based material that is to form the SiOC-based polymer described above. Such a configuration is preferred to achieve high heat resistance of the adhesive layer 30. The SiOC-based material is preferably a siloxane-based organic-inorganic hybrid adhesive. Examples of the primary agent in the siloxane-based organic-inorganic hybrid adhesive include a polymerizable group-containing polyorganosilsesquioxane and a benzocyclobutene (BCB) resin. The polymerizable functional group contained in the polymerizable group-containing polyorganosilsesquioxane is preferably an epoxy group or a (meth)acryloyloxy group. Examples of the BCB resin include 1,3-divinyl-1,1,3,3-tetramethyldisiloxane-benzocyclobutene. A commercially available BCB resin, "CYCLOTEN" available from Dow Chemical Company, can be used.

In the present embodiment, in the composition for forming the adhesive layer 30 containing the polymerizable group-containing polyorganosilsesquioxane, the content ratio of the polymerizable group-containing polyorganosilsesquioxane in the composition is, for example, not less than 70 mass %, preferably from 80 to 99.8 mass %, and more preferably from 90 to 99.5 mass %.

In a case where the composition for forming the adhesive layer 30 containing the polymerizable group-containing polyorganosilsesquioxane, the polymerizable group-containing polyorganosilsesquioxane in the present embodiment contains, as siloxane constituent units, a first constituent unit [$RSiO_{3/2}$] containing at least a constituent unit represented by Formula (1) below and a second constituent unit [$RSiO_{2/2}(OR')$] containing at least a constituent unit represented by Formula (2) below (R and R' in the second constituent unit may be identical or different). These constituent units belong to what are called T units in the siloxane constituent units, and in the present embodiment, the constituent unit [$RSiO_{3/2}$] is a T3 form, and the constituent unit [$RSiO_{2/2}(OR')$] is a T2 form. In the T3 form, the silicon atom is bonded to three oxygen atoms, each oxygen atom also bonded to a silicon atom in another siloxane constituent unit. In the T2 form, the silicon atom is bonded to two oxygen atoms, each oxygen atom also bonded to a silicon atom in another siloxane constituent unit and bonded to an oxygen of an alkoxy group. Both such a T3 form and a T2 form belong to T units as siloxane constituent units as described above and are partial structures of polymerizable group-containing polyorganosilsesquioxanes that can be formed by hydrolysis of a silane compound having three hydrolyzable functional groups and a subsequent condensation reaction.

[Chem. 1]

     (1)

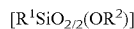     (2)

$R^1$ in Formula (1) and $R^1$ in Formula (2) each represent a group containing an epoxy group or a (meth)acryloyloxy group. $R^2$ in Formula (2) represents a hydrogen atom or an alkyl group having from 1 to 4 carbon atoms.

Examples of $R^1$ in Formulas (1) and (2) when each $R^1$ is an epoxy group-containing group include groups represented by Formulas (3) to (6) below. In Formulas (3) to (6), each of $R^3$, $R^4$, $R^5$, and $R^6$ represents a linear or branched alkylene group having, for example, from 1 to 10 carbon atoms. Examples of such an alkylene group include a methylene group, a methylmethylene group, a dimethylmethylene group, an ethylene group, a propylene group, a trimethylene group, a tetramethylene group, a pentamethylene group, a hexamethylene group, and a decamethylene group. In terms of achieving high heat resistance and reducing shrinkage during curing in the adhesive layer 30 that is formed, $R^1$ in Formula (1) and $R^1$ as an epoxy group-containing group in Formula (2) each are preferably an epoxy group-containing group represented by Formula (3) or an epoxy group-containing group represented by Formula (4) and more preferably a 2-(3,4-epoxycyclohexyl)ethyl group, which is a group represented by Formula (3) where $R^3$ is an ethylene group.

[Chem. 2]

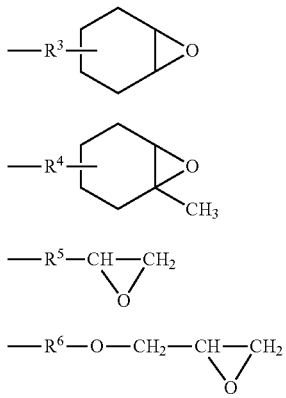

As described above, $R^2$ in Formula (2) above represents a hydrogen atom or an alkyl group having from 1 to 4 carbon atoms, and thus, $OR^2$ in Formula (2) represents a hydroxy group or an alkoxy group having from 1 to 4 carbon atoms. Examples of the alkoxy group having from 1 to 4 carbon atoms include a methoxy group, an ethoxy group, a propoxy group, an isopropoxy group, a butoxy group, and an isobutyloxy group.

The polymerizable group-containing polyorganosilsesquioxane contained in the composition for forming the adhesive layer 30 may contain one type of constituent unit represented by Formula (1) above or may contain two or more types. The polymerizable group-containing polyorganosilsesquioxane may contain one type of constituent unit represented by Formula (2) above or may contain two or more types.

The polymerizable group-containing polyorganosilsesquioxane described above contained in the composition for forming the adhesive layer 30 may contain, as the T3 form, a constituent unit represented by Formula (7) below in addition to the constituent unit represented by Formula (1). $R^7$ in Formula (7) represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group. $R^7$ in Formula (7) is preferably a substituted or unsubstituted alkyl group, a substituted or unsubstituted alkenyl group, or a substituted or unsubstituted aryl group, and more preferably a phenyl group.

[Chem. 3]

     (7)

Examples of the alkyl group described above regarding $R^7$ include a methyl group, an ethyl group, a propyl group, an n-butyl group, an isopropyl group, an isobutyl group, an s-butyl group, a t-butyl group, and an isopentyl group. Examples of the alkenyl group described above regarding $R^7$ include a vinyl group, an allyl group, and an isopropenyl group. Examples of the cycloalkyl group described above regarding $R^7$ include a cyclobutyl group, a cyclopentyl group, and a cyclohexyl group. Examples of the aryl group described above regarding $R^7$ include a phenyl group, a tolyl group, and a naphthyl group. Examples of the aralkyl group described above regarding $R^7$ include a benzyl group and a phenethyl group.

Examples of the substituents of the alkyl group, alkenyl group, cycloalkyl group, aryl group, and aralkyl group described above regarding $R^7$ include an ether group; an ester group; a carbonyl group; a siloxane group; a halogen atom, such as a fluorine atom; an acryl group; a methacryl group; a mercapto group; an amino group; and a hydroxyl group.

The polymerizable group-containing polyorganosilsesquioxane described above contained in the composition for forming the adhesive layer 30 may contain, as the T2 form, a constituent unit represented by Formula (8) below in addition to the constituent unit represented by Formula (2). $R^7$ in Formula (8) represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group and is specifically the same as $R^7$ in Formula (7) above. $R^2$ in Formula (8) represents a hydrogen atom or an alkyl group having from 1 to 4 carbon atoms and is specifically the same as $R^2$ in Formula (2) above.

[Chem. 4]

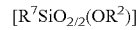     (8)

The polymerizable group-containing polyorganosilsesquioxane may contain in its siloxane constituent unit at least one selected from the group consisting of what is called an M unit [$RSiO_{1/2}$], what is called a D unit [$R_2SiO_{2/2}$], and what is called a Q unit [$SiO_{4/2}$] in addition to the first and second constituent units described above, which are T units.

The polymerizable group-containing polyorganosilsesquioxane may have any of a cage, incomplete cage, ladder, or random silsesquioxane structure or may have a combined structure of two or more of these silsesquioxane structures.

In the total siloxane constituent units of the polymerizable group-containing polyorganosilsesquioxane in the composition for forming the adhesive layer 30, the value of the molar ratio of the T3 form to the T2 form (i.e., T3 form/T2 form) is, for example, from 5 to 500, and the lower limit is preferably 10. The upper limit is preferably 100 and more preferably 50. Adjusting the value of [T3 form/T2 form] to such a range improves compatibility with components other than the polymerizable group-containing polyorganosilsesquioxane contained in the composition for forming the adhesive layer 30, improving handleability. The value of [T3 forms/T2 forms] of the polymerizable group-containing polyorganosilsesquioxane from 5 to 500 means that the presence amount of the T2 form is relatively small relative to T3 forms, and the hydrolysis and the condensation reaction of silanol are more advanced.

The value of the molar ratio (T3 form/T2 form) in the polymerizable group-containing polyorganosilsesquioxane can be determined, for example, by $^{29}$Si-NMR spectroscopy measurements. In the $^{29}$Si-NMR spectrum, the silicon atom in the first constituent unit (T3 form) described above and the silicon atom in the second constituent unit (T2 form) described above indicate peaks or signals with different chemical shifts. The value of the molar ratio can be determined from the area ratio of these peaks. The $^{29}$Si-NMR spectrum of the polymerizable group-containing polyorganosilsesquioxane can be measured, for example, with the following instrument according to the following conditions.

Measuring instrument: "JNM-ECA500NMR" (trade name, available from JEOL Ltd.)
Solvent: Deuteriochloroform
Number of scans: 1800 scans
Measurement temperature: 25° C.

The number average molecular weight (Mn) of the polymerizable group-containing polyorganosilsesquioxane contained in the composition for forming the adhesive layer 30 is preferably from 1000 to 50000, more preferably from 1500 to 10000, even more preferably from 2000 to 8000, and particularly preferably from 2000 to 7000. The polymerizable group-containing polyorganosilsesquioxane with a number average molecular weight of not lower than 1000 improves insulating properties, heat resistance, crack resistance, and adhesiveness of the cured product to be formed. On the other hand, the polymerizable group-containing polyorganosilsesquioxane with a molecular weight of not higher than 50000 improves compatibility with other components in the composition and improves insulating properties, heat resistance, and crack resistance of the cured product.

The molecular weight dispersity (Mw/Mn) of the polymerizable group-containing polyorganosilsesquioxane contained the composition for forming the adhesive layer 30 is preferably from 1.0 to 4.0, more preferably from 1.1 to 3.0, even more preferably from 1.2 to 2.7. The polymerizable group-containing polyorganosilsesquioxane with a molecular weight dispersity of not greater than 4.0 further increases heat resistance, crack resistance, and adhesiveness of the cured product to be formed. On the other hand, with the polyorganosilsesquioxane with a molecular weight dispersity of not less than 1.0, the composition easily becomes liquid, tending to improve its handleability.

The number average molecular weight (Mn) and the weight average molecular weight (Mw) of the polymerizable group-containing polyorganosilsesquioxane are values determined by gel permeation chromatography (GPC) and calibrated with polystyrene. The number average molecular weight (Mn) and the weight average molecular weight (Mw) of the polymerizable group-containing polyorganosilsesquioxane can be measured using, for example, an HPLC instrument ("LC-20AD (trade name)" available from Shimadzu Corporation) according to the following conditions.

Column: Two Shodex KF-801 (upstream side, available from Showa Denko K.K.), Shodex KF-802 (available from Showa Denko K.K.), and Shodex KF-803 (downstream side, available from Showa Denko K.K.) are connected in series
Measurement temperature: 40° C.
Eluent: Tetrahydrofuran (THF)
Sample concentration: From 0.1 to 0.2 mass %
Flow rate: 1 mL/min
Standard sample: Polystyrene
Detector: A UV-VIS detector ("SPD-20A (trade name)" available from Shimadzu Corporation)

The polymerizable group-containing polyorganosilsesquioxane as described above can be manufactured by hydrolysis of a silane compound having three hydrolyzable functional groups and a subsequent condensation reaction. The raw material used in the manufacturing includes at least a compound represented by Formula (9) below and, as necessary, a compound represented by Formula (10) below. The compound represented by Formula (9) is for forming the constituent unit represented by Formula (1) above and the constituent unit represented by Formula (2) above. The compound represented by Formula (10) is for forming the constituent unit represented by Formula (7) above and the constituent unit represented by Formula (8) above.

[Chem. 5]

$$R^1SiX^1{}_3 \qquad (9)$$

$$R^7SiX^2{}_3 \qquad (10)$$

$R^1$ in Formula (9) represents a group containing a polymerizable group and is specifically the same as $R^1$ in Formulas (1) and (2) above. $X^1$ in Formula (9) represents an alkoxy group or a halogen atom. Examples of the alkoxy group include alkoxy groups having from 1 to 4 carbon atoms, such as a methoxy group, an ethoxy group, a propoxy group, an isopropyloxy group, a butoxy group, and an isobutyloxy group. Examples of the halogen atom as $X^1$ include a fluorine atom, a chlorine atom, a bromine atom, and an iodine atom. $X^1$ is preferably an alkoxy group and more preferably a methoxy group and an ethoxy group. In Formula (9), the three $X^1$ may be identical or different from each other.

$R^7$ in Formula (10) represents a substituted or unsubstituted aryl group, a substituted or unsubstituted aralkyl group, a substituted or unsubstituted cycloalkyl group, a substituted or unsubstituted alkyl group, or a substituted or unsubstituted alkenyl group and is specifically the same as $R^7$ in Formulas (7) and (8) above. $X^2$ in Formula (10) represents an alkoxy group or a halogen atom and is specifically the same as X' in Formula (9) above.

The raw material used in the manufacturing of the polymerizable group-containing polyorganosilsesquioxane described above may further contain an additional hydrolyzable silane compound. Examples of such a compound include a hydrolyzable trifunctional silane compound other than the compounds represented by Formulas (9) and (10) above, a hydrolyzable monofunctional silane compound that is to form an M unit, a hydrolyzable bifunctional silane compound that is to form a D unit, and a hydrolyzable tetrafunctional silane compound that is to form a Q unit.

The amount of the hydrolyzable silane compound as the raw material which is used and its composition can be appropriately adjusted according to a structure of the polymerizable group-containing polyorganosilsesquioxane intended to be manufactured. For example, the amount of the compound represented by Formula (9) above that is used is, for example, from 55 to 100 mol % and preferably from 65 to 100 mol % relative to a total amount of the hydrolyzable silane compound used. The amount of the compound represented by Formula (10) above that is used is, for example, from 0 to 70 mol % relative to a total amount of the hydrolyzable silane compound used. The total amount of the compound represented by Formula (9) and the compound represented by Formula (10) that are used relative to a total amount of the hydrolyzable silane compound used is, for example, from 60 to 100 mol %, preferably from 70 to 100 mol %, and more preferably from 80 to 100 mol %.

In using two or more types of hydrolysable silane compounds in the manufacturing of the polymerizable group-containing polyorganosilsesquioxane, the hydrolysis and the condensation reaction for each type of hydrolyzable silane compound can be performed simultaneously or sequentially.

The hydrolysis and the condensation reaction described above are preferably performed in the presence of one type or two or more types of solvents. Examples of preferred solvents include ethers, such as diethyl ether, dimethoxyethane, tetrahydrofuran, and dioxane; and ketones, such as acetone, methyl ethyl ketone, and methyl isobutyl ketone. The amount of the solvent used is appropriately adjusted according to the reaction time and the like within a range of, for example, not greater than 2000 parts by mass per 100 parts by mass of the hydrolyzable silane compound.

The hydrolysis and the condensation reaction described above are preferably allowed to proceed in the presence of one type or two or more types of catalysts and water. The catalyst may be an acid catalyst or may be an alkali catalyst. The amount of the catalyst used is appropriately adjusted within a range of, for example, 0.002 to 0.2 mol per mol of the hydrolyzable silane compound. The amount of the water used is appropriately adjusted within a range of, for example, 0.5 to 20 mol per mol of the hydrolyzable silane compound.

The hydrolysis and the condensation reaction of the hydrolyzable silane compound may be performed in one stage or may be performed in two or more stages. In manufacturing the polymerizable group-containing polyorganosilsesquioxane having a value of the molar ratio (T3 form/T2 form) of not less than 5, the reaction temperature of the hydrolysis and the condensation reaction in the first stage is, for example, from 40 to 100° C. and preferably from 45 to 80° C. The reaction time of the hydrolysis and the condensation reaction in the first stage is, for example, from 0.1 to 10 hours and preferably from 1.5 to 8 hours. The reaction temperature of the hydrolysis and the condensation reaction in the second stage is preferably from 5 to 200° C. and more preferably from 30 to 100° C. Control of the reaction temperature in the above range tends to be able to more efficiently control the value of the molar ratio (T3 form/T2 form) and the number average molecular weight in the desired ranges. In addition, the reaction time of the hydrolysis and the condensation reaction in the second stage is not particularly limited but is preferably from 0.5 to 1000 hours and more preferably from 1 to 500 hours. Furthermore, the hydrolysis and the condensation reaction described above can be performed under normal pressure, under increased pressure, or under reduced pressure. The hydrolysis and the condensation reaction described above is preferably performed under an atmosphere of an inert gas, such as nitrogen or argon.

The hydrolysis and the condensation reaction of the hydrolyzable silane compound as described above provide the polymerizable group-containing polyorganosilsesquioxane described above. After the completion of the reaction, the catalyst is preferably neutralized to prevent ring-opening of the polymerizable group. The polymerizable group-containing polyorganosilsesquioxane thus obtained is purified as necessary.

The composition for forming the adhesive layer 30 preferably contains at least one type of curing catalyst in addition to the polymerizable group-containing polyorganosilsesquioxane, for example, manufactured as described above.

Examples of the curing catalyst in the composition for forming the adhesive layer 30, the composition containing an epoxy group-containing polyorganosilsesquioxane, include thermal cationic polymerization initiators. Examples of the curing catalyst in the composition for forming the adhesive layer 30, the composition containing a (meth)acryloyloxy group-containing polyorganosilsesquioxane, include thermal radical polymerization initiators. The content of the curing catalyst in the composition for forming the adhesive layer 30 is preferably from 0.1 to 3.0 parts by mass per 100 parts by mass of the polymerizable group-containing polyorganosilsesquioxane.

Examples of the thermal cationic polymerization initiator described above include various types of thermal cationic polymerization initiators, such as arylsulfonium salts, aluminum chelates, and boron trifluoride amine complexes. Examples of the arylsulfonium salts include hexafluoroantimonate salts. Examples of the aluminum chelates include ethyl acetoacetate aluminum diisopropylate and aluminum tris(ethyl acetoacetate). Examples of the boron trifluoride amine complexes include a boron trifluoride monoethyl amine complex, a boron trifluoride imidazole complex, and a boron trifluoride piperidine complex.

Examples of the thermal radical polymerization initiators described above include thermal radical polymerization initiators of types, such as azo compounds and peroxides. Examples of the azo compounds include 2,2'-azobisisobutyronitrile, 2,2'-azobis(2,4-dimethylvaleronitrile), 2,2'-azobis(4-methoxy-2,4-dimethylvaleronitrile), dimethyl-2,2'-azobis(2-methylpropionate), dimethyl 2,2'-azobis(isobutyrate), diethyl-2,2'-azobis(2-methylpropionate), and dibutyl-2,2'-azobis(2-methylpropionate). Examples of the peroxides include benzoyl peroxide, t-butyl peroxy-2-ethylhexanoate, 2,5-dimethyl-2 5-di(2-ethylhexanoyl) peroxyhexane, t-butyl peroxybenzoate, t-butyl peroxide, cumene hydroperoxide, dicumyl peroxide, di-t-butyl peroxide, 2,5-dimethyl-2,5-dibutyl peroxyhexane, 2,4-dichlorobenzoyl peroxide, 1,4-di(2-t-butylperoxyi sopropyl) benzene, 1,1-bis(t-butylperoxy)-3,3,5-trimethylcyclohexane, methyl ethyl ketone peroxide, and 1,1,3,3-tetramethylbutyl peroxy-2-ethylhexanoate.

The composition for forming the adhesive layer 30 may contain one type or two or more types of additional curable compounds in addition to the polymerizable group-containing polyorganosilsesquioxane described above. Examples of the curable compound include epoxy compounds other than the polymerizable group-containing polyorganosilsesquioxane described above, (meth)acryloyloxy group-containing compounds, vinyl group-containing compounds, oxetane compounds, and vinyl ether compounds.

Examples of the epoxy compounds other than the polymerizable group-containing polyorganosilsesquioxane described above include alicyclic epoxy compounds (alicyclic epoxy resins), aromatic epoxy compounds (aromatic epoxy resins), and aliphatic epoxy compounds (aliphatic epoxy resins). Examples of the alicyclic epoxy compounds include 3,4,3',4'-diepoxybicyclohexane, 2,2-bis(3,4-epoxycyclohexyl)propane, 1,2-bis(3,4-epoxycyclohexyl)ethane, 2,3-bis(3,4-epoxycyclohexyl)oxirane, bis(3,4-epoxycyclohexylmethyl)ether, and an 1,2-epoxy-4-(2-oxiranyl)cyclohexane adduct of 2,2-bis(hydroxymethyl)-1-butanol (e.g., "EHPE3150 (trade name)" available from Daicel Corporation).

Examples of the aromatic epoxy compounds include epibis-type glycidyl ether-type epoxy resins and novolac-alkyl type glycidyl ether-type epoxy resins.

Examples of the aliphatic epoxy compounds include glycidyl ethers of a q-hydric alcohol (q is a natural number) having no cyclic structure, glycidyl esters of a monocarboxylic acid or a polycarboxylic acid, and epoxy compounds of fat and oil having a double bond. Examples of the epoxy compounds of fat and oil having a double bond include epoxidized linseed oil, epoxidized soybean oil, and epoxidized castor oil.

Examples of the (meth)acryloyloxy group-containing compound described above include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl) isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl) isocyanurate di(meth)acrylate, dicyclopentanyl diacrylate, epoxy acrylate, urethane acrylate, unsaturated polyester, polyester acrylate, polyether acrylate, vinyl acrylate, silicone acrylate, and polystyrylethyl methacrylate. In addition, examples of the (meth)acryloyloxy group-containing compounds described above also include "DA-141" available from Nagase ChemteX Corporation, "Aronix M-211B" and "Aronix M-208" available from Toagosei Co., Ltd., and "NK Ester", "ABE-300", "A-BPE-4", "A-BPE-10", "A-BPE-20", "A-BPE-30", "BPE-100", "BPE-200", "BPE-500", "BPE-900", and "BPE-1300N" available from Shin-Nakamura Chemical Co., Ltd.

Examples of the vinyl group-containing compounds include styrene and divinylbenzene.

Examples of the oxetane compounds include 3,3-bis(vinyloxymethyl)oxetane, 3-ethyl-3-(hydroxymethyl)oxetane, 3-ethyl-3-(2-ethylhexyloxymethyl)oxetane, 3-ethyl-3-(hydroxymethyl)oxetane, 3-ethyl-3-[(phenoxy)methyl]oxetane, 3-ethyl-3-(hexyloxymethyl)oxetane, 3-ethyl-3-(chloromethyl)oxetane, and 3,3-bis(chloromethyl)oxetane.

Examples of the vinyl ether compounds include 2-hydroxyethyl vinyl ether, 3-hydroxypropyl vinyl ether, 2-hydroxypropyl vinyl ether, 2-hydroxyisopropyl vinyl ether, 4-hydroxybutyl vinyl ether, 3-hydroxybutyl vinyl ether, 2-hydroxybutyl vinyl ether, 3-hydroxyisobutyl vinyl ether, 2-hydroxyisobutyl vinyl ether, 1-methyl-3-hydroxypropyl vinyl ether, 1-methyl-2-hydroxypropyl vinyl ether, 1-hydroxymethylpropyl vinyl ether, 4-hydroxycyclohexyl vinyl ether, 1,6-hexanediol monovinyl ether, 1,6-hexanediol divinyl ether, 1,8-octanediol divinyl ether, p-xylene glycol monovinyl ether, p-xylene glycol divinyl ether, m-xylene glycol monovinyl ether, m-xylene glycol divinyl ether, o-xylene glycol monovinyl ether, o-xylene glycol divinyl ether, diethylene glycol monovinyl ether, diethylene glycol divinyl ether, triethylene glycol monovinyl ether, and triethylene glycol divinyl ether.

The composition for forming the adhesive layer 30 preferably contains a solvent to adjust its coating properties and the like. Examples of the solvent include propylene glycol monomethyl ether acetate, methyl ethyl ketone, methyl isobutyl ketone, cyclohexanone, toluene, xylene, ethyl acetate, butyl acetate, 3-methoxybutyl acetate, methoxypropyl acetate, ethylene glycol monomethyl ether acetate, methanol, ethanol, isopropyl alcohol, 1-butanol, 1-methoxy-2-propanol, 3-methoxybutanol, ethoxyethanol, diisopropyl ether, ethylene glycol dimethyl ether, and tetrahydrofuran.

The composition for forming the adhesive layer 30 may further contain an additive of various types, such as a silane coupling agent, an antifoaming agent, an antioxidant, an antiblocking agent, a leveling agent, a surfactant, a bulk filler, an anti-corrosive agent, an antistatic agent, and a plasticizer.

In the adhesive layer 30 or the siloxane-based organic-inorganic hybrid adhesive, the proportion of carbon is preferably from 20 to 70 mass %, more preferably from 30 to 70 mass %, and even more preferably from 40 to 60 mass %; the proportion of hydrogen is preferably from 2 to 20 mass %, more preferably from 3 to 15 mass %, and even more preferably from 4 to 10 mass %; the proportion of oxygen is preferably from 10 to 40 mass %, more preferably from 15 to 35 mass %, and even more preferably from 20 to 30 mass %; and the proportion of silicon is preferably from 3 to 40 mass %, more preferably from 5 to 30 mass %, and even more preferably from 10 to 20 mass %. Such a constitution is suitable for the adhesive layer 30 that is formed to exhibit sufficient wafer bonding strength while the thickness of the adhesive layer 30 that is formed is set to, for example, not greater than 5 µm, in addition to achieving high heat resistance and reducing shrinkage during curing in the adhesive layer 30 that is formed. Each element described above can be identified, for example, by CHN elemental analysis, Si quantitative analysis (gravimetry), ICP emission analysis, or X-ray photoelectron spectroscopy.

In the wafer bonding described above using the composition for forming the adhesive layer 30 as described above, for example, the composition for forming the adhesive layer 30 is coated to the surface of one wafer, which is the surface to be bonded, by spin coating to form an adhesive composition layer, and the composition layer is dried and solidified by heating. The heating temperature in the heating is, for example, from 50 to 150° C., and the heating time is, for example, from 5 to 120 minutes. Then, the two wafers are bonded under applying pressure via the adhesive composition layer formed on one of the wafers, and then the adhesive composition layer is cured by heating. In the bonding, the pressure is, for example, from 300 to 5000 g/cm², and the temperature is, for example, from 30 to 200° C. The heating temperature for curing is, for example, from 100 to 300° C., and the heating time is, for example, from 5 to 120 minutes. For the composition for forming the adhesive layer 30 containing the polymerizable group-containing polyorganosilsesquioxane as a curable resin, the adhesive composition is preferably heated at a temperature of not lower than room temperature and not higher than 80° C. before the bonding described above and is cured at a temperature of 100 to 200° C. after the bonding.

The thickness of the adhesive layer 30 thus formed is preferably not greater than 5 µm, more preferably not greater than 4 µm, and even more preferably not greater than 3 µm. The thickness of the adhesive layer 30 is, for example, not less than 0.5 µm.

In the present method for manufacturing a semiconductor device, then, as illustrated in FIG. 1(b), an insulating film 21 is formed on the main surface 20a of the wafer 20. The insulating film 21 covers the main surface 20a of the wafer 20 and has a recessed portion with a predetermined pattern shape. In this recessed portion, a wiring pattern is to be formed as described later.

The insulating film 21 can be formed, for example, as follows. First, an insulating material film is formed on the main surface 20a of the wafer 20 by a thermal oxidation method or a CVD method. Examples of the insulating material film include a silicon oxide film and a silicon nitride film. Then, a predetermined resist pattern is formed on the insulating material film by a lithography technique. Then, the insulating material film is patterned by etching the insulating material film utilizing the resist pattern as an etching mask. The etching treatment is performed, for example, by wet etching. Thereafter, the resist pattern is removed. For example, as described above, the insulating film 21 having a recessed portion with a predetermined pattern shape can be formed.

In the present method for manufacturing a semiconductor device, then, as illustrated in FIG. 1(c), a hole H as a through hole is formed in the wafer laminate W (hole formation). Specifically, first, a resist pattern as an etching mask is formed on the insulating film 21. This resist pattern has openings for forming the hole at a location corresponding to a location where the hole is to be formed in the wafer laminate W. Then, in the wafer laminate W, the hole H is formed by etching the wafer laminate W from the wafer 20 side via the resist pattern as an etching mask, the hole H extending through the wafer 20 and the adhesive layer 30 and reaching the wiring pattern 12 in the wafer 10. In this etching treatment, reactive ion etching is performed. In the etching treatment on the wafer 20, reactive ion etching by a Bosch process is preferably performed, and a mixed gas containing $SiF_6$ and Ar is preferably employed as the etching gas. In the subsequent etching treatment on the adhesive layer 30, a mixed gas containing $CHF_3$, $CF_4$; $O_2$, and Ar is preferably employed as the etching gas. In addition, in the wiring pattern 12b, a portion facing the hole H forms a bottom surface of the hole H.

In the present method for manufacturing a semiconductor device, then, as illustrated in FIG. 2(a), an insulating film 41 is conformally formed on an inner surface of the hole H of the wafer laminate W. The insulating film 41 is, for example, a silicon oxide film and is formed, for example, by a CVD method.

Then, as illustrated in FIG. 2(b), a portion of the insulating film 41, the portion on the bottom surface of the hole H, is etched away. Specifically, a portion of the insulating film 41 in the hole H, the portion on the wiring pattern 12b, is removed, for example, by reactive ion etching. As the etching gas in the reactive ion etching, a mixed gas containing $CHF_3$, $CF_4$, and Ar is preferably employed.

In the present method for manufacturing a semiconductor device, the wafer laminate W in which the hole H is formed is then subjected to a cleaning treatment (cleaning). The cleaning treatment in the present cleaning includes an oxygen plasma cleaning treatment and/or an argon sputtering cleaning treatment. In the present cleaning, the oxygen plasma cleaning treatment is preferably performed, followed by the argon sputtering cleaning treatment. In addition, in the present cleaning, a sulfuric acid cleaning treatment may be performed. The sulfuric acid cleaning treatment is preferably performed between the oxygen plasma cleaning treatment and the subsequent argon sputtering cleaning treatment.

In performing the oxygen plasma cleaning treatment in the cleaning, the treatment time is preferably from 5 to 120 seconds, more preferably from 10 to 60 seconds, and even more preferably from 15 to 40 seconds. In performing the argon sputtering cleaning treatment in the cleaning, the treatment time is preferably from 0.5 to 5 minutes and more preferably from 2 to 4 minutes. In performing the sulfuric acid cleaning treatment in the cleaning, the treatment time is preferably from 10 to 100 seconds and more preferably from 20 to 90 seconds. The concentration of the sulfuric acid used in the sulfuric acid cleaning treatment is, for example, from 1 to 3 mass %.

Then, a barrier layer (not illustrated) is conformally formed on a wall surface of the hole H, and then a conductive material 50 is deposited as illustrated in FIG. 3(a). Examples of a material forming the barrier layer include Ta. As the conductive material 50, Cu is employed in the present embodiment. As a deposition technique for the conductive material 50, an electroplating method can be employed. In employing the electroplating method, after forming the barrier layer, a seed layer for electroplating is conformally formed in the hole H, for example, by a sputtering deposition method. Examples of a material forming the seed layer include Cu. In the electroplating method, Cu is grown on this seed layer.

Then, an excess deposition portion of the conductive material 50 is removed as illustrated in FIG. 3(b). Examples of a removal technique include chemical mechanical polishing (CMP). By such a removal, a conductive portion 51 is formed in the hole H of the wafer laminate W, and a wiring pattern 52 is to be formed in the recessed portion of the insulating film 21. The diameter of the conductive portion 51 is, for example, from 5 to 20 μm in the present embodiment. The wiring pattern 52 is a constituent of a rewiring layer to be formed on the wafer 20 and is to be electrically connected to a predetermined semiconductor element fabricated on the main surface 20a side of the wafer 20. The conductive portion 51 is structurally and electrically connected to the wiring pattern 12b in the circuit forming surface 10a of the wafer 10 and is structurally and electrically connected to the wiring pattern 52. Such a conductive portion 51 is to form a through electrode for electrically connecting a semiconductor element derived from the wafer 10 and a semiconductor element derived from the wafer 20 in a semiconductor device to be manufactured.

Thereafter, a series of processes from the lamination of a further wafer 20 via the adhesive layer 30 onto the wafer 20 in which the rewiring layer is formed on the main surface 20a to the formation of the conductive portion 51 is performed a predetermined number of times according to the number of laminations of the semiconductor elements of the semiconductor device to be manufactured.

In the present method for manufacturing a semiconductor device, the wafer 10 may be thinned by grinding from its back surface 10b side. The thickness of the wafer 10 after thinning is, for example, from 10 to 400 μm. In addition, a bump for external connection may be formed on the rewiring layer of the wafer 20 laminated latest. Alternatively, a through electrode extending through the wafer 10 after thinning and electrically connected to a predetermined wiring pattern in the rewiring layer on the circuit forming surface 10a side of the wafer 10 is formed, and a bump for external connection, the bump being electrically connected to the through electrode, may be formed on the back surface 10b side of the wafer 10.

As described above, the semiconductor device having a three-dimensional structure in which semiconductor elements are integrated in their thickness direction can be manufactured. This semiconductor device may be divided into individual pieces by dicing.

In the present method for manufacturing a semiconductor device, as described above, the conductive portion 51 that is to form a through electrode for electrically connecting the semiconductor elements is structurally and electrically connected to the wiring pattern 12b of the circuit forming surface 10a of the wafer 10. Such a bumpless structure is suitable for achieving a short conductive path between the semiconductor elements to be multi-layered. In the WOW process known in the art, a bump electrode that is electrically connected to a through electrode extending through the wafer is formed on the wafer surface, and an electrical connection between the semiconductor elements may be attempted via the bump electrode. In contrast, in the present method for manufacturing a semiconductor device, the conductive portion 51 that is to form a through electrode is directly connected to the wiring pattern 12b in the wafer 10, and thus a bumpless structure is formed in the electrical connection between the semiconductor elements. Such a bumpless structure is suitable for achieving a short conductive path between the semiconductor elements which are multi-layered, and the shorter the conductive path between the semiconductor elements which are multi-layered, the smaller the resistance of the conductive path or the wiring between the elements tends to be.

Additionally, the present method for manufacturing a semiconductor device is a method to form multi-layered semiconductor elements through laminating semiconductor wafers via the adhesive layer 30, and the adhesive layer 30 bonding the wafers contains an SiOC-based polymer as an adhesive. Together with this, in the present method, the wafer laminate W, in which the hole H extending through the wafer 20 and the adhesive layer 30 is formed, is subjected to the cleaning treatment including the oxygen plasma cleaning treatment and/or the argon sputtering cleaning treatment in the cleaning. The present invention has found that these configurations are suitable for achieving low contact resistance between the conductive portion 51 or the through electrode which are formed in the hole H and the wiring pattern 12b in the wafer 10. This is, for example, as shown with reference to examples and comparative examples described later. The smaller the contact resistance between the conductive portion 51 or the through electrode in the hole H and the wiring pattern 12b in the wafer 10, the smaller the resistance of the entire conductive path or the entire wiring between the semiconductor elements that is electrically connected via the through electrode in the semiconductor device to be manufactured tends to be.

As described above, the present method for manufacturing a semiconductor device is suitable for achieving low wiring resistance between the semiconductor elements that are multi-layered in the semiconductor device to be manufactured. Such a method for manufacturing a semiconductor device is suitable for reducing high speed signal transmission at low power consumption in the semiconductor device to be manufactured and is also suitable for reducing attenuation of a high frequency signal.

The adhesive layer 30 in the present method is preferably a cured product of an adhesive composition containing a polymerizable group-containing polyorganosilsesquioxane, as described above. Such an adhesive layer 30 is suitable for achieving high heat resistance as well as achieving lower curing temperature for forming the adhesive layer 30 and thus preventing damage to the elements in the wafer as an adherend.

The thickness of the adhesive layer 30 in the present method is preferably not greater than 5 μm, more preferably not greater than 4 μm, and even more preferably not greater than 3 μm, as described above. Such a configuration is suitable for achieving a shorter conductive portion 51 or through electrode which are formed in the present method and thus is suitable for reducing the resistance of the entire conductive path or the entire wiring between the semiconductor elements which are electrically connected via the through electrode. In addition, the adhesive layer 30 containing the siloxane-based organic-inorganic hybrid adhesive is suitable for exhibiting sufficient wafer bonding strength even with such a small thickness.

Additionally, the thinner the adhesive layer 30, the easier it is to reduce the etching residue in the hole H at each stage which has undergone the hole formation described above with reference to FIG. 1(c) and the subsequent cleaning. The reduction of the etching residue in the hole H contributes to the reduction of the contact resistance described above.

Still more, the thinner the adhesive layer 30, the easier it is to prevent formation of an undercut or side etching on a surface of the adhesive layer 30, the surface exposed to the hole, in the hole formation described above with reference to FIG. 1(c), and thus the easier it is to form the conductive portion 51 conformally to the hole H having an appropriate shape. Such a configuration contributes to preventing occurrence of what is called leakage current in the conductive portion 51.

The thickness of the wafer 20 in the present method is not greater than 30 μm, preferably not greater than 20 μm, and more preferably not greater than 15 μm, as described above. Such a configuration is suitable for achieving a shorter conductive portion 51 or through electrode which is formed in the present method and thus is suitable for reducing the resistance of the entire conductive path or the entire wiring between the semiconductor elements which are electrically connected via the through electrode.

In addition, the wafer 20 and the adhesive layer 30 are thin as described above, thus contributing to reducing the size and increasing the density of the semiconductor device to be manufactured by the present method.

EXAMPLES

Example 1

As described below, a total number of 71 through electrodes were formed in a predetermined wafer laminate.
Production of Wafer Laminate First, a first silicon wafer (300 mm in diameter) with a rewiring layer on its surface and a second silicon wafer (300 mm in diameter) were prepared. The rewiring layer of the first silicon wafer included a Cu wiring pattern having a region exposed outward of the rewiring layer. Then, the rewiring side of the first silicon wafer and the second silicon wafer were bonded using an adhesive composition C described later. Specifically, first, a predetermined amount of the adhesive composition C was coated to the surface of one wafer by spin coating to form an adhesive composition layer, and the composition layer was dried and solidified by heating. In the heating, the composition layer was heated first at 80° C. for 4 minutes and then at 100° C. for 2 minutes. Then, the two wafers were bonded under applied pressure via the adhesive composition layer formed on one of the wafers, and then the adhesive composition layer was cured by heating. In the bonding, the pressure is, for example, 1000 g/cm$^2$, and the temperature was 50° C. In the curing, the composition layer was heated first at 135° C. for 30 minutes and then at 170° C. for 30 minutes. The thickness of the adhesive layer bonding the wafers was 2.5 µm. As described above, a wafer laminate having a laminated structure including the first and second silicon wafers and the adhesive layer (2.5 µm in thickness) bonding these wafers were produced.

Process for Wafer Laminate

Then, the second silicon wafer in the wafer laminate was ground using a grinder ("DGP8761HC (trade name)" available from DISCO Corporation), and the second silicon wafer was thinned to a thickness of 10 µm. Then, a silicon oxide film (insulating film) was formed on the ground surface of the second silicon wafer by a CVD method. Then, a recessed portion having a predetermined pattern shape was formed on the insulating film. The recessed portion was formed after a predetermined resist pattern had been formed on the insulating film by a lithography technique. The recessed portion was formed by etching the insulating material film utilizing the resist pattern as an etching mask.

Then, the resist pattern was removed from the insulating film, the hole (through hole) was formed in the wafer laminate. Specifically, first, a resist pattern as an etching mask was formed on the insulating film. This resist pattern had openings for forming the hole at the location corresponding to the location where the hole was to be formed in the wafer laminate. Then, in the wafer laminate, the hole was formed by etching the wafer laminate from the second wafer side via the resist pattern as an etching mask, the hole extending through the second wafer (10 µm in thickness) and the adhesive layer (2.5 µm in thickness) and reaching the wiring pattern in the first wafer. In this etching treatment, first, a first etching treatment on the second silicon wafer was performed, followed by a second etching treatment on the adhesive layer. In the first etching treatment, an etching apparatus ("Silivia (trade name)" available from Applied Materials, Inc.) was used, reactive ion etching by a Bosch process was performed, and a mixed gas of $SiF_6$ and Ar was used as the etching gas. In the second etching treatment, an etching apparatus ("e-MAX (trade name)" available from Applied Materials, Inc.) was used, reactive ion etching was performed, and a mixed gas of $CHF_3$, $CF_4O_2$, and Ar was used as the etching gas.

Then, a silicon oxide film was conformally formed on an inner surface of the hole of the wafer laminate by a CVD method. Then, a portion of this silicon oxide film, the portion on a bottom surface of the hole, was etched away. In the etching treatment for this procedure, an etching apparatus ("e-MAX (trade name)" available from Applied Materials, Inc.) was used, reactive ion etching was performed, and a mixed gas of $CHF_3$, $CF_4$, and Ar was used as the etching gas.

Then, the wafer laminate was subjected to a cleaning treatment. Specifically, an oxygen plasma cleaning treatment was performed on the wafer laminate in which the hole was formed, and then a sulfuric acid cleaning treatment was performed. In the oxygen plasma cleaning treatment, a plasma apparatus ("e-MAX (trade name)" available from Applied Materials, Inc.) was used, oxygen gas was used, the temperature condition was 120° C., and the plasma ashing (cleaning treatment) time was 15 seconds. In the sulfuric acid cleaning treatment, a cleaning apparatus ("GPTC-1" (trade name)) was used, a 2 mass % sulfuric acid was used, and the cleaning treatment time was 43 seconds.

Then, a Ta barrier layer (80 nm in thickness) was formed by a CVD method on a wall surface of the hole that has undergone the cleaning treatment, and then a Cu seed layer (1 µm in thickness) for electroplating was conformally formed by a sputtering deposition method. Then, Cu was deposited by an electroplating method throughout the inside of the hole in the wafer laminate and in the recessed portion included in the insulating film on the second silicon wafer in the wafer laminate. Then, an excess deposition portion of Cu on the second silicon wafer was removed by a CMP method. As a result, a through electrode was formed in the hole of the wafer laminate, and the wiring pattern was formed in the recessed portion of the insulating film on the second silicon wafer of the wafer laminate.

Production of Adhesive Composition C

An adhesive composition C was obtained by mixing 100 parts by mass of an epoxy group-containing polyorganosilsesquioxane prepared as described below, 115 parts by mass of propylene glycol monomethyl ether acetate, 0.45 parts by mass (as a solid content) of an antimony-based sulfonium salt ("SI-150L" (trade name)" available from Sanshin Chemical Industry Co., Ltd.), and 0.05 parts by mass of (4-hydroxyphenyl)dimethylsulfonium methyl sulfite ("SAN-AID SI Auxiliary Agent (trade name)" available from Sanshin Chemical Industry Co., Ltd.).

Synthesis of Polyorganosilsesquioxane

In a 300-mL flask equipped with a reflux condenser, a nitrogen gas inlet tube, a stirrer, and a thermometer, 161.5 mmol (39.79 g) of 2-(3,4-epoxycyclohexyl)ethyltrimethoxysilane, 9 mmol (1.69 g) of phenyltrimethoxysilane, and 165.9 g of acetone as a solvent were mixed, and the temperature was raised to 50° C. Then, to the mixture, 4.7 g of a 5% potassium carbonate aqueous solution (1.7 mmol as potassium carbonate) was added dropwise over 5 minutes, and then 1700 mmol (30.6 g) of water was added dropwise over 20 minutes. No significant temperature rise occurred in the mixture during the drop-wise procedure. After the drop-wise addition procedure, a polycondensation reaction was performed at 50° C. for 4 hours while nitrogen gas was introduced into the flask. A product in the reaction solution after the polycondensation reaction, as analyzed, had a number average molecular weight of 1900 and a molecular weight dispersity of 1.5. In addition, the reaction solution allowed to stand to cool was repeatedly washed with water until a lower layer solution (aqueous phase) generated by a phase separation became neutral, then an upper layer solution was collected. The solvent was distilled off from the upper layer solution under conditions of 1 mmHg and 40° C. until the amount of the solvent became 25 mass %, and a colorless transparent liquid product (epoxy group-containing polyorganosilsesquioxane) was obtained.

Example 2

A process of Example 2 was performed on the wafer laminate described above in the same manner as in the process of Example 1 except that the oxygen plasma cleaning treatment was not performed in the cleaning and that an argon sputtering cleaning treatment was performed after the sulfuric acid cleaning treatment in the cleaning. In the argon sputtering cleaning treatment in Example 2, a sputtering apparatus ("Producer (trade name)" available from Applied Materials, Inc.) was used, and Ar sputtering (cleaning treatment) time was 3 minutes.

Example 3

A process of Example 3 was performed on the wafer laminate described above in the same manner as in the process of Example 1 except that an argon sputtering cleaning treatment was performed after the sulfuric acid cleaning treatment in the cleaning. In the argon sputtering cleaning treatment in Example 3, a sputtering apparatus ("Producer (trade name)" available from Applied Materials, Inc.) was used, and Ar sputtering (cleaning treatment) time was 3 minutes.

Example 4

A process of Example 4 was performed on the wafer laminate described above in the same manner as in the process of Example 1 except that the cleaning treatment time of the sulfuric acid cleaning treatment was changed from 43 seconds to 86 seconds in the cleaning and that an argon sputtering cleaning treatment was performed after the sulfuric acid cleaning treatment in the cleaning. In the argon sputtering cleaning treatment in Example 4, a sputtering apparatus ("Producer (trade name)" available from Applied Materials, Inc.) was used, and Ar sputtering (cleaning treatment) time was 3 minutes.

Comparative Example 1

A process of Comparative Example 1 was performed on the wafer laminate described above in the same manner as in the process of Example 1 except that the oxygen plasma cleaning treatment was not performed in the cleaning.

Resistance Value Measurement

Figure 4:
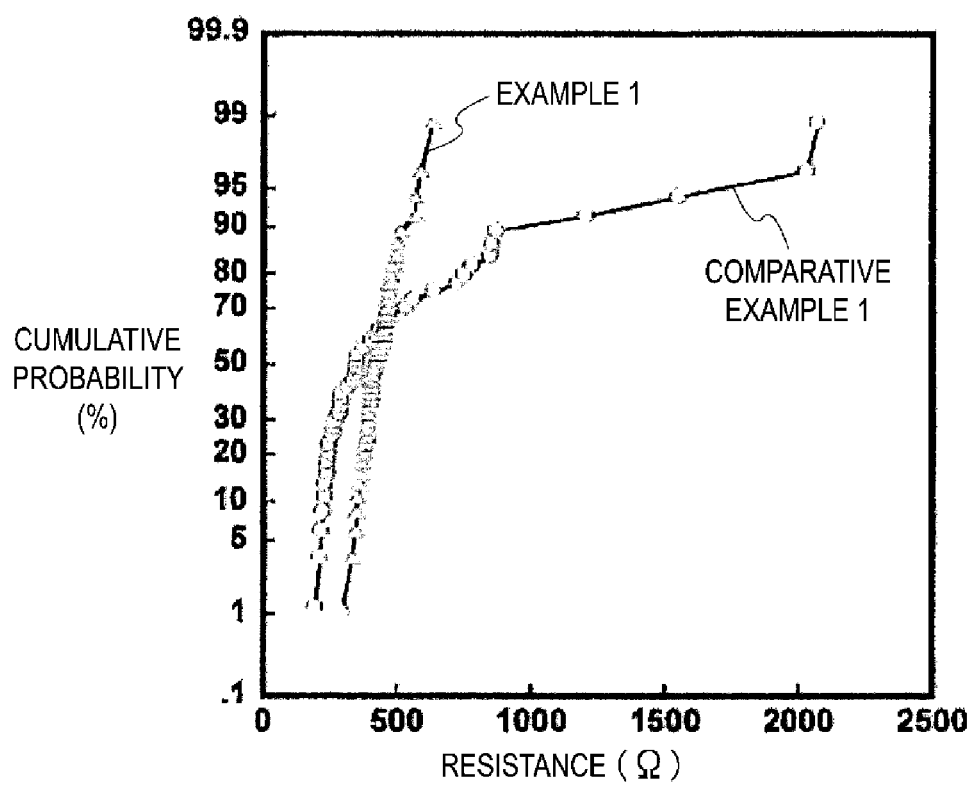
FIG. 4 is a graph showing each chain resistance measurement result according to Example 1 and Comparative Example 1.
Figure 5:
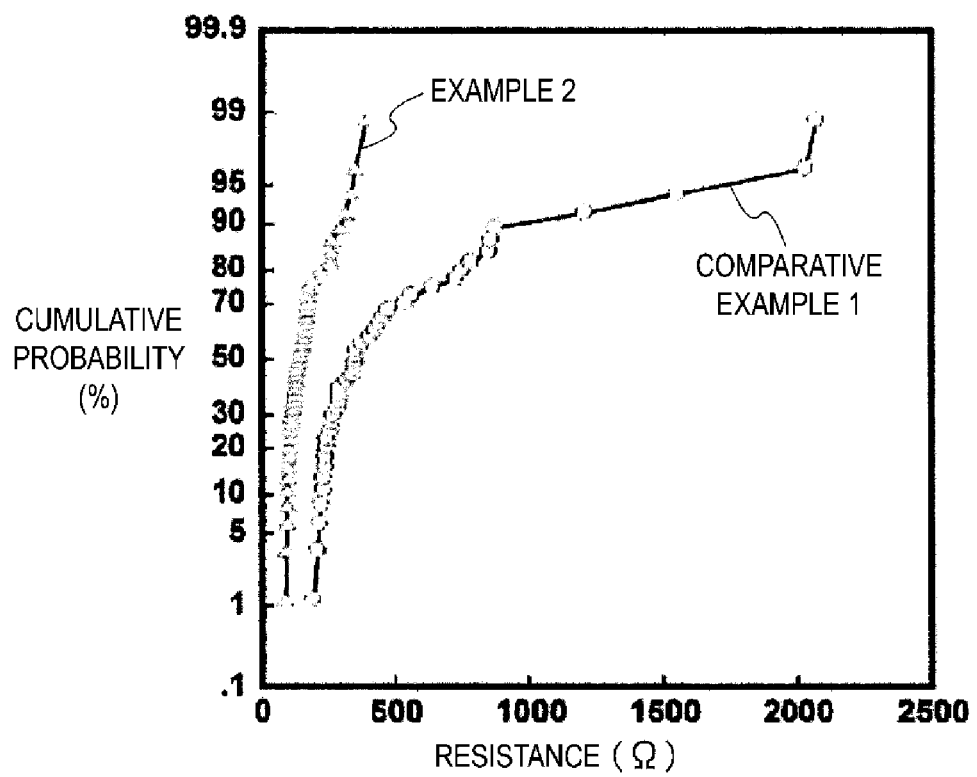
FIG. 5 is a graph showing each chain resistance measurement result according to Example 2 and Comparative Example 1.
Figure 6:
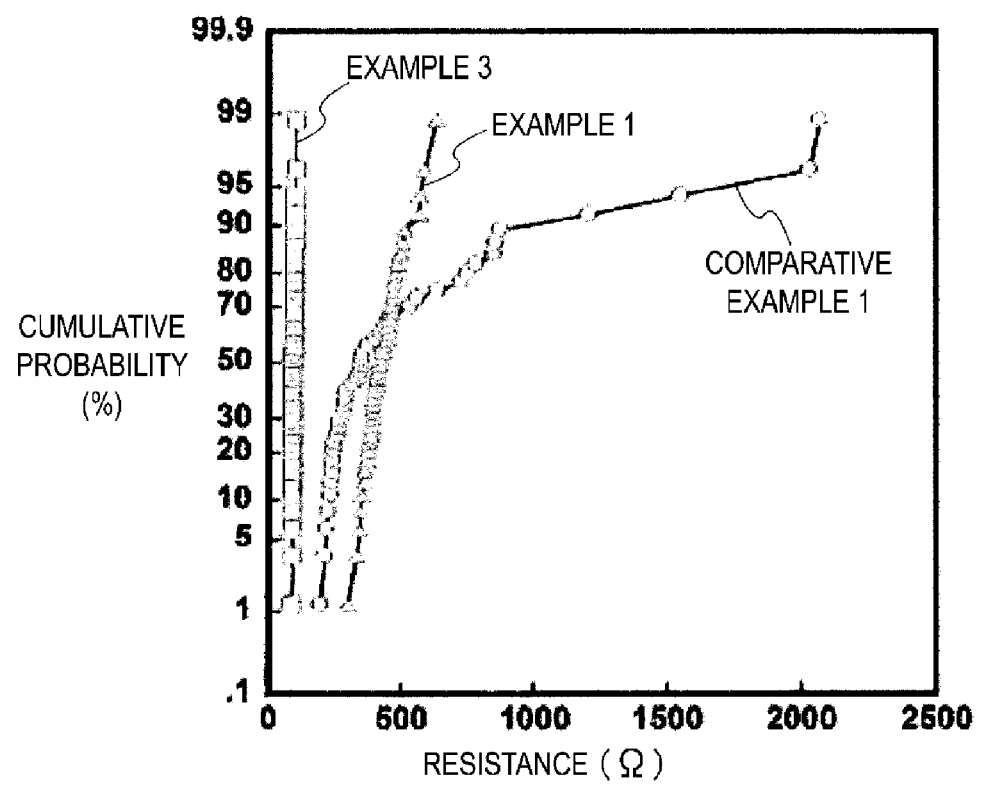
FIG. 6 is a graph showing each chain resistance measurement result according to Examples 1 and 3 and Comparative Example 1.
Figure 7:
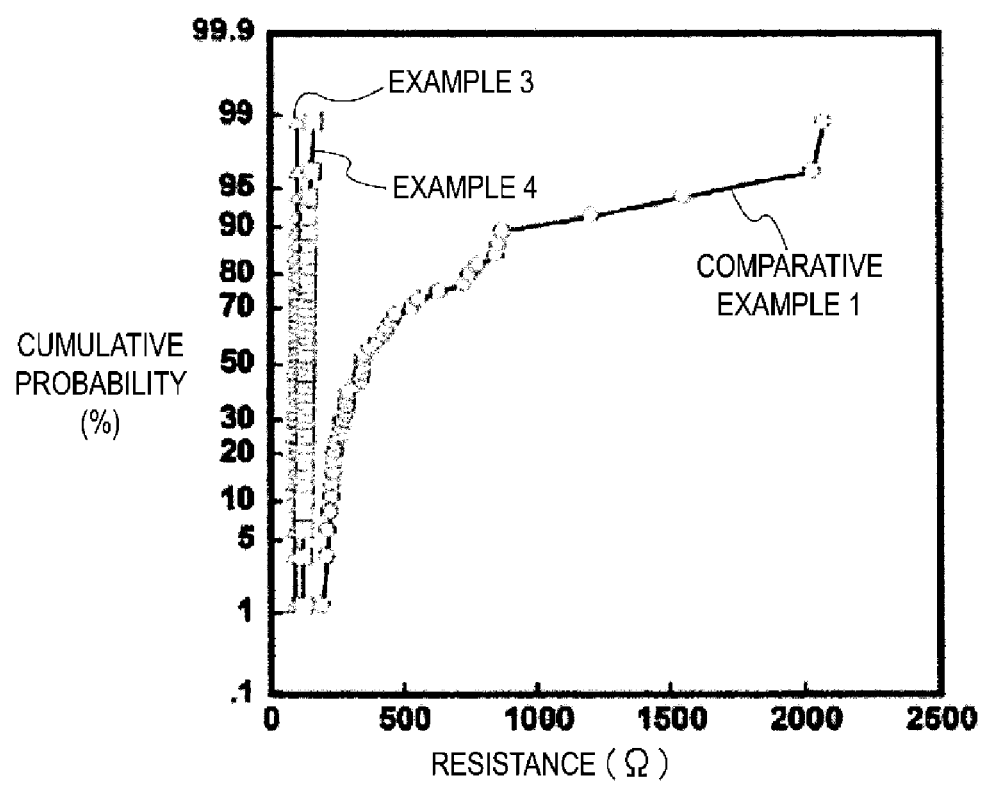
FIG. 7 is a graph showing each chain resistance measurement result according to Examples 3 and 4 and Comparative Example 1.

For each wafer laminate of Examples 1 to 4 and Comparative Example 1, the value of the chain resistance (daisy chain resistance) of the total number of 71 through electrodes formed was measured. The measurement results are shown in FIGS. 4 to 7. FIG. 4 is a graph showing each chain resistance measurement result according to Example 1 and Comparative Example 1. FIG. 5 is a graph showing each chain resistance measurement result according to Example 2 and Comparative Example 1. FIG. 6 is a graph showing each chain resistance measurement result according to Example 1, Example 3, and Comparative Example 1. FIG. 7 is a graph showing each chain resistance measurement result according to Example 3, Example 4, and Comparative Example 1. In each graph, the horizontal axis represents the resistance value ($\Omega$), and the vertical axis represents the cumulative probability (%). In addition, each plot in the graph indicates contact resistance of one predetermined through electrode (contact resistance between the wiring pattern of the first silicon wafer and the through electrode on the wiring pattern).

Evaluation

In the resistance value measurement described above, the contact resistances of measurement points of 99% of the through electrode formed by the methods of Examples 1 to 4 were not greater than 700$\Omega$ (Example 1), not greater than 450$\Omega$ (Example 2), not greater than 150$\Omega$ (Example 3), and not greater than 250$\Omega$ (Example 4). From the graphs shown in FIG. 4 to FIG. 7, it could be seen that the contact resistance values of the through electrodes formed in the methods of Examples 1 to 4 were greatly reduced, and the variations are greatly reduced than the contact resistance value of the through electrode formed in the method of Comparative Example 1.

To summarize the above, configurations of the present invention and its variations will be described below.

(1) A method for manufacturing a semiconductor device, the method including:

<1> preparing a wafer laminate having a laminated structure including a first wafer having a circuit forming surface including a wiring pattern, a second wafer having a main surface and a back surface opposite to the main surface, and an adhesive layer containing an SiOC-based polymer and provided between the circuit forming surface of the first wafer and the back surface of the second wafer;

<2> forming a hole in the wafer laminate W by etching the wafer laminate W from the second wafer side via a mask pattern masking a portion of the main surface side of the second wafer, the hole extending through the second wafer and the adhesive layer and reaching a wiring pattern on the first wafer;

<3> forming an insulating film on an inner surface of the hole;

<4> etching away a portion of the insulating film in the hole, the portion on the wiring pattern;

<5> subjecting the wafer laminate that has undergone the etching away in <4> to a cleaning treatment including an oxygen plasma cleaning treatment and/or an argon sputtering cleaning treatment; and <6> forming a conductive portion by filling a conductive material into the hole that has undergone the cleaning treatment.

(2) The method for manufacturing a semiconductor device according to (1), wherein the SiOC-based polymer has a proportion of carbon of 20 to 70 mass %, 30 to 70 mass %, or 40 to 60 mass %; a proportion of hydrogen of 2 to 20 mass %, 3 to 15 mass %, or 4 to 10 mass %; a proportion of oxygen of 10 to 40 mass %, 15 to 35 mass %, or 20 to 30 mass %; and a proportion of silicon of 3 to 40 mass %, 5 to 30 mass %, or 10 to 20 mass %.

(3) The method for manufacturing a semiconductor device according to (1) or (2), wherein the etching treatment is reactive ion etching.

(4) The method for manufacturing a semiconductor device according to any one of (1) to (3), wherein the cleaning treatment includes an oxygen plasma cleaning treatment and a subsequent argon sputtering cleaning treatment.

(5) The method for manufacturing a semiconductor device according to any one of (1) to (4), wherein a treatment time of the oxygen plasma cleaning treatment is from 5 to 120 seconds, from 10 to 60 seconds, or from 15 to 40 seconds.

(6) The method for manufacturing a semiconductor device according to any one of (1) to (5), wherein a treatment time of the argon sputtering cleaning treatment is from 0.5 to 5 minutes or from 2 to 4 minutes.

(7) The method for manufacturing a semiconductor device according to any one of (1) to (6), wherein the cleaning treatment includes a sulfuric acid cleaning treatment between the oxygen plasma cleaning treatment and the argon sputtering cleaning treatment.

(8) The method for manufacturing a semiconductor device according to (7), wherein a treatment time of the sulfuric acid cleaning treatment is from 10 to 100 seconds or from 20 to 90 seconds.

(9) The method for manufacturing a semiconductor device according to any one of (1) to (8), wherein a technique for filling the conductive material in <6> is an electroplating method.

(10) The method for manufacturing a semiconductor device according to any one of (1) to (9), wherein the adhesive layer is a cured product of an adhesive composition containing a siloxane-based organic-inorganic hybrid adhesive.

(11) The method for manufacturing a semiconductor device according to any one of (1) to (10), wherein the adhesive layer is a cured product of an adhesive composition containing a polymerizable group-containing polyorganosilsesquioxane.

(12) The method for manufacturing a semiconductor device according to (11), wherein a content ratio of the polymerizable group-containing polyorganosilsesquioxane in the adhesive composition is not less than 70 mass %, from 80 to 99.8 mass %, or from 90 to 99.5 mass %.

(13) The method for manufacturing a semiconductor device according to (11) or (12), wherein the polymerizable group-containing polyorganosilsesquioxane contains, as siloxane constituent units, a first constituent unit $[RSiO_{3/2}]$ containing at least a constituent unit represented by Formula (1) and a second constituent unit $[RSiO_{2/2}(OR')]$ containing at least a constituent unit represented by Formula (2) (R and R' in the second constituent unit may be identical or different)

[Chem. 6]

$$[R^1SiO_{3/2}] \quad (1)$$

$$[R^1SiO_{2/2}(OR^2)] \quad (2)$$

wherein $R^1$ in Formula (1) and $R^1$ in Formula (2) each represent a group containing an epoxy group or a (meth)acryloyloxy group; and $R^2$ in Formula (2) represents a hydrogen atom or an alkyl group having from 1 to 4 carbon atoms.

(14) The method for manufacturing a semiconductor device according to any one of (11) to (13), wherein a number average molecular weight (Mn) of the polymerizable group-containing polyorganosilsesquioxane is from 1000 to 50000, from 1500 to 10000, from 2000 to 8000, or from 2000 to 7000.

(15) The method for manufacturing a semiconductor device according to any one of (11) to (14), wherein a molecular weight dispersity (Mw/Mn) of the polymerizable group-containing polyorganosilsesquioxane is from 1.0 to 4.0, from 1.1 to 3.0, or from 1.2 to 2.7.

(16) The method for manufacturing a semiconductor device according to any one of (1) to (15), wherein a thickness of the adhesive layer is not greater than 5 μm, not greater than 4 μm, or not greater than 3 μm, and not less than 0.5 μm.

(17) The method for manufacturing a semiconductor device according to any one of (1) to (16), wherein the second wafer has a thickness of not greater than 20 μm or not greater than 15 μm.

INDUSTRIAL APPLICABILITY

The method according to an embodiment of the present invention can achieve low wiring resistance between semiconductor elements that is bonded via an adhesive layer and multi-layered.

REFERENCE SIGNS LIST

W Wafer laminate
10, 20 Wafer
10a Circuit forming surface
10b Back surface
12 Rewiring layer
12a Insulating portion
12b Wiring pattern
20a Main surface
20b Back surface
21 Insulating film
30 Adhesive layer
H Hole
50 Conductive material
51 Conductive portion

The invention claimed is:

1. A method for manufacturing a semiconductor device, the method comprising:
   (1) preparing a wafer laminate having a laminated structure comprising a first wafer having a circuit forming surface comprising a wiring pattern, a second wafer having a main surface and a back surface opposite to the main surface, and an adhesive layer containing an SiOC-based polymer and provided between the circuit forming surface of the first wafer and the back surface of the second wafer;
   (2) forming a hole in the wafer laminate by etching the wafer laminate from the second wafer side via a mask pattern masking a portion of the main surface side of the second wafer, the hole extending through the second wafer and the adhesive layer and reaching a wiring pattern on the first wafer;
   (3) forming an insulating film on an inner surface of the hole;
   (4) etching away a portion of the insulating film in the hole, the portion being on the wiring pattern;
   (5) subjecting the wafer laminate that has undergone the etching away in (4) to a cleaning treatment comprising (i) an oxygen plasma cleaning treatment and a subsequent argon sputtering cleaning treatment, and (ii) a sulfuric acid cleaning treatment; and
   (6) forming a conductive portion by filling a conductive material into the hole that has undergone the cleaning treatment.

2. The method for manufacturing a semiconductor device according to claim 1, wherein a treatment time of the oxygen plasma cleaning treatment is from 5 to 120 seconds.

3. The method for manufacturing a semiconductor device according to claim 1, wherein a treatment time of the argon sputtering cleaning treatment is from 0.5 to 5 minutes.

4. The method for manufacturing a semiconductor device according to claim 1, wherein the cleaning treatment comprises the sulfuric acid cleaning treatment between the oxygen plasma cleaning treatment and the argon sputtering cleaning treatment.

5. The method for manufacturing a semiconductor device according to claim 1, wherein the adhesive layer is a cured product of an adhesive composition containing a polymerizable group-containing polyorganosilsesquioxane.

6. The method for manufacturing a semiconductor device according to claim 1, wherein the adhesive layer has a thickness of not greater than 5 μm.

7. The method for manufacturing a semiconductor device according to claim 1, wherein the second wafer has a thickness of not greater than 20 μm.

* * * * *